US009240405B2

United States Patent
Chen et al.

(10) Patent No.: US 9,240,405 B2
(45) Date of Patent: Jan. 19, 2016

(54) MEMORY WITH OFF-CHIP CONTROLLER

(75) Inventors: Shih-Hung Chen, Hsinchu (TW);
Hang-Ting Lue, Hsinchu (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 1105 days.

(21) Appl. No.: 13/089,652

(22) Filed: Apr. 19, 2011

(65) Prior Publication Data
US 2012/0267689 A1    Oct. 25, 2012

(51) Int. Cl.
*H01L 27/118*    (2006.01)
*H01L 27/06*    (2006.01)
*H01L 27/02*    (2006.01)
*H01L 27/105*    (2006.01)
*H01L 27/115*    (2006.01)

(52) U.S. Cl.
CPC ........ *H01L 27/0688* (2013.01); *H01L 27/0207* (2013.01); *H01L 27/105* (2013.01); *H01L 27/1052* (2013.01); *H01L 27/1157* (2013.01); *H01L 27/11565* (2013.01); *H01L 27/11573* (2013.01); *H01L 27/11578* (2013.01)

(58) Field of Classification Search
CPC ..................... H01L 27/10897; H01L 27/1116; H01L 27/11286; H01L 27/1052; H01L 25/18; H01L 27/11575; H01L 27/115; H01L 27/11548; H01L 27/11595; H01L 27/11585; H01L 24/00–24/98; H01L 27/11572; H01L 24/0098
See application file for complete search history.

(56) References Cited

U.S. PATENT DOCUMENTS

| | | | |
|---|---|---|---|
| 4,630,086 A | 12/1986 | Sato et al. |
| 4,959,812 A | 9/1990 | Momodomi et al. |
| 5,270,969 A | 12/1993 | Iwahashi |
| 5,278,439 A | 1/1994 | Ma et al. |

(Continued)

FOREIGN PATENT DOCUMENTS

| | | |
|---|---|---|
| EP | 1411555 A2 | 4/2004 |
| EP | 01677311 A1 | 7/2006 |

(Continued)

OTHER PUBLICATIONS

Search Report mailed May 9, 2008 in European Application No. 06000064.3 filed on Jan. 3, 2006, 3 pages.

(Continued)

*Primary Examiner* — Phat X Cao
*Assistant Examiner* — Diana C Vieira
(74) *Attorney, Agent, or Firm* — Yiding Wu; Haynes Beffel & Wolfeld LLP

(57) ABSTRACT

An integrated circuit memory device, including a memory circuit and a peripheral circuit, is described which is suitable for low cost manufacturing. The memory circuit and peripheral circuit for the device are implemented in different layers of a stacked structure. The memory circuit layer and the peripheral circuit layer include complementary interconnect surfaces, which upon mating together establish the electrical interconnection between the memory circuit and the peripheral circuit. The memory circuit layer and the peripheral circuit layer can be formed separately using different processes on different substrates in different fabrication lines. This enables the use of independent fabrication process technologies, one arranged for the memory array, and another arranged for the supporting peripheral circuit. The separate circuitry can then be stacked and bonded together.

16 Claims, 9 Drawing Sheets

(56) References Cited

U.S. PATENT DOCUMENTS

| | | |
|---|---|---|
| 5,286,994 A | 2/1994 | Ozawa et al. |
| 5,319,229 A | 6/1994 | Shimoji et al. |
| 5,338,952 A | 8/1994 | Yamauchi |
| 5,355,464 A | 10/1994 | Fandrich et al. |
| 5,408,115 A | 4/1995 | Chang |
| 5,412,603 A | 5/1995 | Schreck et al. |
| 5,424,569 A | 6/1995 | Prall |
| 5,448,517 A | 9/1995 | Iwahashi |
| 5,483,486 A | 1/1996 | Javanifard et al. |
| 5,485,422 A | 1/1996 | Bauer et al. |
| 5,509,134 A | 4/1996 | Fandrich et al. |
| 5,515,324 A | 5/1996 | Tanaka |
| 5,566,120 A | 10/1996 | D'Souza |
| 5,574,929 A | 11/1996 | Pieterse et al. |
| 5,602,775 A | 2/1997 | Vo |
| 5,644,533 A | 7/1997 | Lancaster et al. |
| 5,668,029 A | 9/1997 | Huang et al. |
| 5,694,356 A | 12/1997 | Wong et al. |
| 5,745,410 A | 4/1998 | Yiu et al. |
| 5,753,950 A | 5/1998 | Kojima |
| 5,768,192 A | 6/1998 | Eitan |
| RE35,838 E | 7/1998 | Momodomi et al. |
| 5,793,677 A | 8/1998 | Hu et al. |
| 5,835,396 A | 11/1998 | Zhang |
| 5,872,034 A | 2/1999 | Schlais et al. |
| 5,877,054 A | 3/1999 | Yamauchi |
| 5,883,409 A | 3/1999 | Guterman et al. |
| 5,895,949 A | 4/1999 | Endoh |
| 5,897,351 A | 4/1999 | Forbes |
| 5,952,692 A | 9/1999 | Nakazato et al. |
| 5,966,603 A | 10/1999 | Eitan |
| 6,011,725 A | 1/2000 | Eitan |
| 6,026,026 A | 2/2000 | Chan et al. |
| 6,034,896 A | 3/2000 | Ranaweera et al. |
| 6,074,917 A | 6/2000 | Chang et al. |
| 6,096,603 A | 8/2000 | Chang et al. |
| 6,103,572 A | 8/2000 | Kirihara |
| 6,151,248 A | 11/2000 | Harari et al. |
| 6,169,693 B1 | 1/2001 | Chan et al. |
| 6,172,907 B1 | 1/2001 | Jenne |
| 6,194,272 B1 | 2/2001 | Sung |
| 6,215,148 B1 | 4/2001 | Eitan |
| 6,218,700 B1 | 4/2001 | Papadas |
| 6,219,276 B1 | 4/2001 | Parker |
| 6,289,175 B1 | 9/2001 | De' Longhi |
| 6,297,096 B1 | 10/2001 | Boaz |
| 6,320,786 B1 | 11/2001 | Chang et al. |
| 6,322,903 B1 | 11/2001 | Siniaguine et al. |
| 6,356,478 B1 | 3/2002 | McCollum |
| 6,363,013 B1 | 3/2002 | Lu et al. |
| 6,380,068 B2 | 4/2002 | Jeng et al. |
| 6,396,741 B1 | 5/2002 | Bloom et al. |
| 6,436,768 B1 | 8/2002 | Yang et al. |
| 6,458,642 B1 | 10/2002 | Yeh et al. |
| 6,469,343 B1 | 10/2002 | Miura et al. |
| 6,487,114 B2 | 11/2002 | Jong et al. |
| 6,512,696 B1 | 1/2003 | Fan et al. |
| 6,522,585 B2 | 2/2003 | Pasternak |
| 6,538,923 B1 | 3/2003 | Parker |
| 6,552,386 B1 | 4/2003 | Wu |
| 6,566,699 B2 | 5/2003 | Eitan |
| 6,587,903 B2 | 7/2003 | Roohparvar |
| 6,614,070 B1 | 9/2003 | Hirose et al. |
| 6,614,694 B1 | 9/2003 | Yeh et al. |
| 6,617,639 B1 | 9/2003 | Wang et al. |
| 6,643,181 B2 | 11/2003 | Sofer et al. |
| 6,643,185 B1 | 11/2003 | Wang et al. |
| 6,645,813 B1 | 11/2003 | Hsieh |
| 6,646,924 B1 | 11/2003 | Tsai et al. |
| 6,653,712 B2 | 11/2003 | Knall et al. |
| 6,653,733 B1 | 11/2003 | Gonzalez et al. |
| 6,657,252 B2 | 12/2003 | Fried et al. |
| 6,657,894 B2 | 12/2003 | Yeh et al. |
| 6,670,240 B2 | 12/2003 | Ogura et al. |
| 6,670,671 B2 | 12/2003 | Sasago et al. |
| 6,674,138 B1 | 1/2004 | Halliyal et al. |
| 6,677,200 B2 | 1/2004 | Lee et al. |
| 6,690,601 B2 | 2/2004 | Yeh et al. |
| 6,709,928 B1 | 3/2004 | Jenne et al. |
| 6,714,457 B1 | 3/2004 | Hsu et al. |
| 6,720,614 B2 | 4/2004 | Lin et al. |
| 6,720,630 B2 | 4/2004 | Mandelman et al. |
| 6,731,544 B2 | 5/2004 | Han et al. |
| 6,734,065 B2 | 5/2004 | Yim et al. |
| 6,737,675 B2 | 5/2004 | Patel et al. |
| 6,740,928 B2 | 5/2004 | Yoshii et al. |
| 6,744,105 B1 | 6/2004 | Chen et al. |
| 6,750,525 B2 | 6/2004 | Yim et al. |
| 6,768,661 B2 | 7/2004 | Vyvoda et al. |
| 6,784,480 B2 | 8/2004 | Bhattacharyya |
| 6,795,357 B1 | 9/2004 | Liu et al. |
| 6,798,012 B1 | 9/2004 | Ma et al. |
| 6,815,805 B2 | 11/2004 | Weimer |
| 6,818,558 B1 | 11/2004 | Rathor et al. |
| 6,825,523 B2 | 11/2004 | Caprara et al. |
| 6,829,175 B2 | 12/2004 | Tsai et al. |
| 6,841,813 B2 | 1/2005 | Walker et al. |
| 6,849,905 B2 | 2/2005 | Ilkbahar et al. |
| 6,856,551 B2 | 2/2005 | Mokhlesi et al. |
| 6,858,899 B2 | 2/2005 | Mahajani et al. |
| 6,858,906 B2 | 2/2005 | Lee et al. |
| 6,885,044 B2 | 4/2005 | Ding |
| 6,888,750 B2 | 5/2005 | Walker et al. |
| 6,891,262 B2 | 5/2005 | Nomoto et al. |
| 6,897,514 B2 | 5/2005 | Kouznetsov et al. |
| 6,897,533 B1 | 5/2005 | Yang et al. |
| 6,911,691 B2 | 6/2005 | Tomiie et al. |
| 6,912,163 B2 | 6/2005 | Zheng et al. |
| 6,925,007 B2 | 8/2005 | Harari et al. |
| 6,927,448 B2 | 8/2005 | Liu |
| 6,933,555 B2 | 8/2005 | Hsieh |
| 6,937,511 B2 | 8/2005 | Hsu et al. |
| 6,942,320 B2 | 9/2005 | Chung et al. |
| 6,970,383 B1 | 11/2005 | Han et al. |
| 6,977,201 B2 | 12/2005 | Jung |
| 6,995,424 B2 | 2/2006 | Lee |
| 6,996,011 B2 | 2/2006 | Yeh et al. |
| 7,005,349 B2 | 2/2006 | Lee et al. |
| 7,005,366 B2 | 2/2006 | Chau et al. |
| 7,009,882 B2 | 3/2006 | Chen et al. |
| 7,012,297 B2 | 3/2006 | Bhattacharyya |
| 7,015,540 B2 | 3/2006 | Ishii et al. |
| 7,018,895 B2 | 3/2006 | Ding |
| 7,026,682 B2 | 4/2006 | Chung et al. |
| 7,042,045 B2 | 5/2006 | Kang et al. |
| 7,057,234 B2 | 6/2006 | Tiwari |
| 7,071,061 B1 | 7/2006 | Pittikoun et al. |
| 7,075,828 B2 | 7/2006 | Lue et al. |
| 7,078,762 B2 | 7/2006 | Ishii et al. |
| 7,106,625 B2 | 9/2006 | Yeh |
| 7,115,469 B1 | 10/2006 | Halliyal et al. |
| 7,115,942 B2 | 10/2006 | Wang |
| 7,120,059 B2 | 10/2006 | Yeh |
| 7,129,538 B2 | 10/2006 | Lee et al. |
| 7,133,313 B2 | 11/2006 | Shih |
| 7,133,317 B2 | 11/2006 | Liao et al. |
| 7,135,734 B2 | 11/2006 | Eldridge et al. |
| 7,151,692 B2 | 12/2006 | Wu |
| 7,154,143 B2 | 12/2006 | Jung et al. |
| 7,154,779 B2 | 12/2006 | Mokhlesi et al. |
| 7,157,769 B2 | 1/2007 | Forbes |
| 7,158,420 B2 | 1/2007 | Lung |
| 7,164,603 B2 | 1/2007 | Shih et al. |
| 7,166,513 B2 | 1/2007 | Hsu et al. |
| 7,187,590 B2 | 3/2007 | Zous et al. |
| 7,190,614 B2 | 3/2007 | Wu |
| 7,209,386 B2 | 4/2007 | Yeh |
| 7,209,389 B2 | 4/2007 | Lung et al. |
| 7,209,390 B2 | 4/2007 | Lue et al. |
| 7,242,622 B2 | 7/2007 | Hsu et al. |
| 7,250,646 B2 | 7/2007 | Walker et al. |
| 7,279,740 B2 | 10/2007 | Bhattacharyya et al. |
| 7,399,674 B2 | 7/2008 | Chen et al. |
| 7,473,589 B2 | 1/2009 | Lai et al. |

(56) References Cited

U.S. PATENT DOCUMENTS

| | | |
|---|---|---|
| 7,683,459 B2 | 3/2010 | Ma et al. |
| 7,709,334 B2 | 5/2010 | Lai et al. |
| 7,944,753 B2 | 5/2011 | Lee et al. |
| 8,212,298 B2 | 7/2012 | Masuoka et al. |
| 2001/0012663 A1 | 8/2001 | Magri' et al. |
| 2001/0045615 A1 | 11/2001 | Ajit |
| 2001/0055838 A1 | 12/2001 | Walker et al. |
| 2002/0167844 A1 | 11/2002 | Han et al. |
| 2002/0179958 A1 | 12/2002 | Kim |
| 2003/0023603 A1 | 1/2003 | Ellison et al. |
| 2003/0025147 A1 | 2/2003 | Nomoto et al. |
| 2003/0030100 A1 | 2/2003 | Lee et al. |
| 2003/0032242 A1 | 2/2003 | Lee et al. |
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2004/0079983 A1 | 4/2004 | Chae et al. |
| 2004/0084714 A1 | 5/2004 | Ishii et al. |
| 2004/0108512 A1 | 6/2004 | Iwata et al. |
| 2004/0119122 A1 | 6/2004 | Ilkbahar et al. |
| 2004/0125629 A1 | 7/2004 | Scheuerlein et al. |
| 2004/0145024 A1 | 7/2004 | Chen et al. |
| 2004/0183126 A1 | 9/2004 | Bae et al. |
| 2004/0256679 A1 | 12/2004 | Hu |
| 2005/0001258 A1 | 1/2005 | Forbes |
| 2005/0006696 A1 | 1/2005 | Noguchi et al. |
| 2005/0023603 A1 | 2/2005 | Eldridge et al. |
| 2005/0062091 A1 | 3/2005 | Ding |
| 2005/0062098 A1 | 3/2005 | Mahajani et al. |
| 2005/0074937 A1 | 4/2005 | Jung |
| 2005/0093054 A1 | 5/2005 | Jung |
| 2005/0218522 A1 | 10/2005 | Nomoto et al. |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0255652 A1 | 11/2005 | Nomoto et al. |
| 2005/0270849 A1 | 12/2005 | Lue |
| 2005/0281085 A1 | 12/2005 | Wu |
| 2006/0007732 A1 | 1/2006 | Yeh |
| 2006/0044872 A1 | 3/2006 | Nazarian |
| 2006/0088983 A1 | 4/2006 | Fujisawa et al. |
| 2006/0197145 A1 | 9/2006 | Pittikoun et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202256 A1 | 9/2006 | Harari |
| 2006/0202261 A1 | 9/2006 | Lue et al. |
| 2006/0245246 A1 | 11/2006 | Lung |
| 2006/0258090 A1 | 11/2006 | Bhattacharyya et al. |
| 2006/0261401 A1 | 11/2006 | Bhattacharyya |
| 2006/0275986 A1 | 12/2006 | Kobayashi et al. |
| 2006/0281260 A1 | 12/2006 | Lue |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0032018 A1 | 2/2007 | Tuntasood et al. |
| 2007/0045718 A1 | 3/2007 | Bhattacharyya |
| 2007/0069283 A1 | 3/2007 | Shih et al. |
| 2007/0076477 A1 | 4/2007 | Hwang et al. |
| 2007/0117323 A1 | 5/2007 | Yeh |
| 2007/0138539 A1 | 6/2007 | Wu et al. |
| 2007/0152313 A1* | 7/2007 | Periaman et al. ............ 257/686 |
| 2008/0153200 A1* | 6/2008 | Sitaram ........................ 438/106 |
| 2009/0230376 A1* | 9/2009 | Ryoo et al. ...................... 257/2 |
| 2009/0243115 A1* | 10/2009 | Lee et al. ..................... 257/773 |
| 2009/0302448 A1* | 12/2009 | Huang ........................... 257/686 |

FOREIGN PATENT DOCUMENTS

| | | |
|---|---|---|
| EP | 01677312 A1 | 7/2006 |
| EP | 1689002 A2 | 8/2006 |
| JP | 60-032340 | 2/1985 |
| JP | 04-199570 | 7/1992 |
| JP | 05-243482 | 9/1993 |
| JP | 09162313 A | 6/1997 |
| JP | 11040682 A | 2/1999 |
| JP | 11233653 A | 8/1999 |
| JP | 2002368141 A | 12/2002 |
| JP | 2004363329 A | 12/2004 |
| WO | 9428551 | 12/1994 |
| WO | 0137347 A1 | 5/2001 |

OTHER PUBLICATIONS

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 filed on Jan. 3, 2006, 4 pages.

Search Report mailed Nov. 14, 2007 in European Application No. 06000093.2 (Pub. No. EP-01677312) filed on Jan. 3, 2006, 4 pages.

Aminzadeh et al., "Conduction and Charge Trapping in Polysilicon-Silicon Nitride-Oxide—Silicon Structures under Positive Gate Bias," IEEETrans. on Electron Dev. 35(4) Apr. 1998 459-467.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4 (2003).

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Bude, J.D., et al., "Secondary Electron Flash—a High Performance, Low Power Flash Technology for 0.35 um and Below," IEEE IEDM 1997, 11.3.1-11.3.4.

Chang, Kuo-Tung, et al., "A New SONOS Memory Using Source-Side Injection for Programming," IEEE Electron Device Letters, vol. 19, No. 7, Jul. 1998, 253-255.

Chindalore et al., "A New Combination-Erase Technique for Erasing Nitride Based (SONOS) Nonvolatile Memories," IEEE Electron Dev Lett 24(4) Apr. 2003, 257-259.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1-26.6.4.

Chung, Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

DiMaria, D.J., et al., "Conduction Studies in Silicon Nitride: Dark Currents and Photocurrents," IBM J. Res. Dev. May 1977, 227-244.

Eitan, Boaz, "Can NROM, a 2-bit, Trapping Storage NVM Cell, Give a Real Challenge to Floating Gate Cells?" SSDM, Tokyo, Japan (1999), 3 pages.

Eitan et al., "NROM: A Novel Localized Trapping, 2-Bit Nonvolatile Memory Cell," IEEE Electron Device Lett 21(11) Nov. 2000, 543-545.

(56) References Cited

OTHER PUBLICATIONS

Fujiwara, I., et al., "0.13 .mu.m MONOS single transistor memory cell with deparated source lines," IEDM 1998, 995-998.
Govoreanu et al., "An Investigation of the Electron Tunneling Leakage Current through Ultathin Oxides/High-k Gate Stacks at Inversion Conditions," IEEE SISPAD Int'l Conf. Sep. 3-5, 2003, 287-290.
Govoreanu et al., "Simulation of Nanofloating Gate Memory with High-k Stacked Dielectrics," IEEE SISPAD Int'l Conf. 305 Sep. 2003, 299-302.
Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.
Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.
Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.
Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pluse 24 pages from outline.
Ito et al., "A Novel MINOS Techology Using Gate Hole Injection in Erase Operation for Embedded Nonvolatile Memory Applications," 2004 Symp. on VLSI Tech Digest of Tech Papers 2004, 80-81.
Janai, Meir, "Data Retention, Endurance and Acceleration Factors of NROM Devices," IEEE 41st Annual International Reliability Physics Symposium, Dallas, Texas, 2003, 502-505.
Kim et al., "Robust Multi-bit Programmable Flash Memory Using a Resonant Tunnel Barrier," Electron Dev. Mtg. Dec. 5-7, 2005, IEDM Tech Dig. 861-864.
Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.
Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.
Lee, Chang, et al., "A Novel SONOS Structure of SiO2/SiN/Al2O3 with TaN Metal Gate for Multi-Giga Bit Flash Memeries," IEEE 2003 4 pages.
Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6..4 (2003).
Lee, Jae-Duk, et al., "Effects of Floating-Gate Interference on NAND Flash Memory Cell Operation," IEEE Electron Device Letters, vol. 23, No. 5, May 2002, 264-266.
Likharev, "Layered Tunnel Barriers for Nonvolatile Memory Devices," Appl. Phys. Lett. 73(15) Oct. 1998 2137-2139.
Liu, Zhizheng et al., "A New Programming Technique for Flash Memory Devices," International Symposium on VLSI Technology, Systems and Applications, Jun. 8-10, 1999, 195-198.
Lue et al., "A Novel P-Channel NAND-Type Flash memory with 2-bit/cell Operation and High Programming Throughput (>20 MB/sec)," IEEE 2005, 4 pages.
Lue et al., "BE-SONOS: A Bandgap Engineered SONOS with Excellent Performance and Reliability," IEDM Tech Digest, IEEE Int'l Dec. 2005, 547-550.
Minami et al., "New Scaling Guidelines for MNOS Nonvolatile Memory Devices," IEEE Trans on Electron Devices 38 (11) Nov. 1991 2519-2526.
Rippard, W.H., et al., "Ultrathin Aluminum Oxide Tunnel Barriers," Phys. Rev. Lett. 88(4), Jan. 28, 2002, 4 pages.
Sasago, Y. et al., "90-nm-node multi-level AG-AND type flash memory with cell size of true 2 F/sup 2//bit and programming throughput of 10 MB/s," IEDM, 2003, pp. 823-826.
Shih et al., "A Novel 2-bit/cell Nitride Storage Flash memory with Greater than 1M P/E-cycle Endurance," IEEE IEDM 2004, pp. 36.3.1-36.3.4.
Shin, Yoocheol, et al., "High Reliable SONOS-type NAND Flash Memory Cell with Al2O3 for Top Oxide," Non-Volatile Semiconductor Memory Workshop, 2003, 2 pages.
Sung, et al., "Multi-layer SONOS with Direct Tunnel Oxide for High Speed and Long Retention Time," IEEE 2002 Nanoelectronics Workshop, Jun. 2002, 83-84.
Takata, M., et al., "New Non-Volatile Memory with Extremely High Density Metal Nano-Dots," IEEE IEDM 03-553, 22.5.1-22.5.4, date unknown.
Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.
Walker, et al., "3D TFT-SONOS Memory Cell for Ultra-High Density File Storage Applications," 2003 Symposium on VLSI Tech Digest of Technical Papers, 29-30.
Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.
White, Marvin, H., et al., "On the Go with SONOS," Circuits and Devices Magazine, IEEE , vol. 16 , Issue: 4 , Jul. 2000, pp. 22-31.
Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International , Dec. 8-10, 2003, pp. 7.5.1-7.5.4.

\* cited by examiner

MEMORY WITH OFF-CHIP CONTROLLER

BACKGROUND

1. Field of the Invention

The present invention relates generally to integrated circuit memory devices.

2. Description of Related Art

In the manufacturing of high density memory devices, the amount of data per unit area on an integrated circuit can be a critical factor. Thus, as the critical dimensions of the memory devices approach technology limits, techniques for stacking multiple levels of memory cells have been proposed in order to achieve greater storage density and lower costs per bit. Also, new memory technologies are being deployed, including phase change memory, ferromagnetic memory, metal oxide based memory and so on.

The memory technologies being deployed can require a different sequence of manufacturing steps, than do the supporting peripheral circuits such as the logic for address decoders, state machines, and command decoders. As a result of the need to support the manufacturing steps for both the memory array and the peripheral circuits, the manufacturing lines needed to implement memory devices can be more expensive, or compromises are made in the type of circuitry implemented in the peripheral circuits. This leads to higher costs for integrated circuits made using more advanced technologies.

As costs for manufacturing higher and higher memory capacity in integrated circuit memory devices continues to increase, it is desirable to provide an integrated circuit memory structure having a lower manufacturing costs.

SUMMARY

An integrated circuit memory device, including a memory circuit and a peripheral circuit, is described which is suitable for low cost manufacturing. The memory circuit and peripheral circuit for the device are implemented in different layers of a stacked structure. The memory circuit layer and the peripheral circuit layer include complementary interconnect surfaces, which upon mating together establish the electrical interconnection between the memory circuit and the peripheral circuit. The memory circuit layer and the peripheral circuit layer can be formed separately using different processes on different substrates in different fabrication lines. This enables the use of independent fabrication process technologies, one arranged for the memory array, and another arranged for the supporting peripheral circuit. The separate circuitry can then be stacked and packaged together.

A method for manufacturing a memory device described herein includes forming a memory circuit comprising a plurality of memory cells. The memory circuit has a first interconnect surface having a first set of interconnect locations. Interconnect locations in the first set of interconnect locations are electrically coupled to corresponding memory cells in the plurality of memory cells. The method also includes forming a peripheral circuit configured to provide control signals to operate the memory circuit. The peripheral circuit has a second interconnect surface with a second set of interconnect locations. The method further includes joining the first interconnect surface of the memory circuit to the second interconnect surface of the peripheral circuit, such that interconnect locations in the first set of interconnect locations are electrically coupled to corresponding interconnect locations in the second set of interconnect locations.

A memory device described herein includes a memory circuit comprising a plurality of memory cells. The memory circuit has a first interconnect surface with a first set of interconnect locations. Interconnect locations in the first set of interconnect locations are electrically coupled to corresponding memory cells in the plurality of memory cells. The memory device also includes a peripheral circuit to provide control signals to operate the memory circuit. The peripheral circuit has a second interconnect surface with a second set of interconnect locations. The second interconnect surface of the peripheral circuit is joined to the first interconnect surface of the memory circuit at an interconnect interface, such that interconnect locations in the first set of interconnect locations are electrically coupled to corresponding interconnect locations in the second set of interconnect locations.

Other aspects and advantages of the present technology can be seen on review of the drawings, the detailed description, and the claims which follow.

DETAILED DESCRIPTION

A detailed description of embodiments of the present invention is provided with reference to the FIGS. 1-10.

Figure 1:
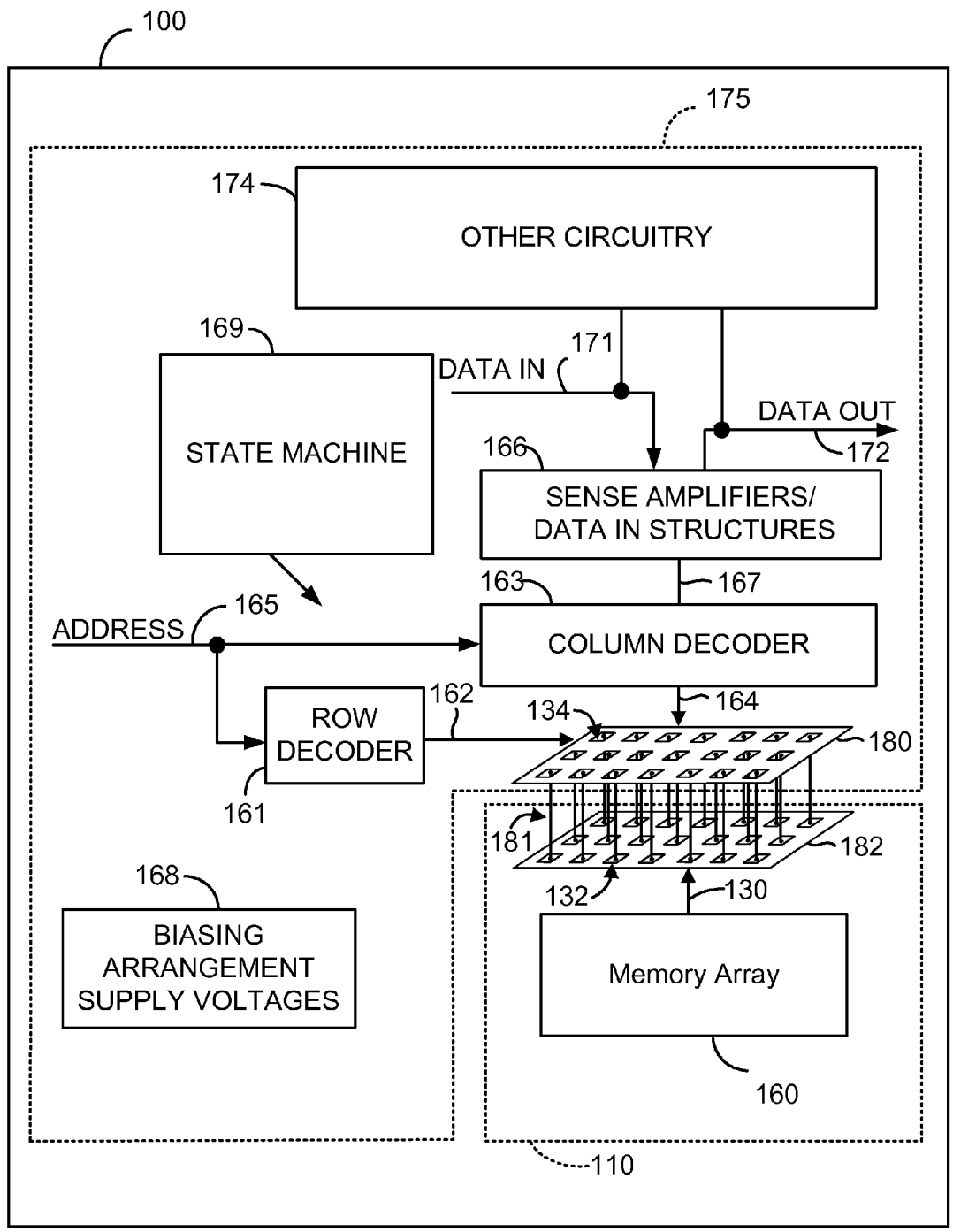
FIG. 1 is a simplified block diagram of an integrated circuit memory device including a memory circuit and a peripheral circuit joined at an interconnect interface as described herein.

FIG. 1 is a simplified block diagram of a stacked integrated circuit memory device 100 including a memory circuit 110 and a peripheral circuit 175 as described herein. The memory circuit 110 and the peripheral circuit 175 are physically separated onto different layers of the device 100, and are joined via an interconnect interface 181. The terms "joined" or "joining" as used herein refer to configurations where the memory circuit 110 is attached, affixed or otherwise physically connected to the peripheral circuit 175. The terms encompass configurations where the memory circuit 110 is directly affixed to the peripheral circuit 175, such as through bonding. The terms further encompass configurations whereby the memory circuit 110 is indirectly connected to the peripheral circuit 175 through the use of intermediate "interposer" member or element.

The memory circuit 110 includes a memory array 160. Word lines (not shown) are arranged along rows in the memory array 160. Bit lines (not shown) are arranged along columns in the memory array 160 for reading and programming the memory cells (not shown) in the memory array 160. As used herein, the term "access line" refers generally to bit lines, source lines, and/or word lines. The memory circuit 110 may also include also include other circuitry, such as high voltage transistors or drivers, which may provide better performance when included on the same chip as the memory array 160.

The memory circuit 110 includes an interconnect surface 182 having a set of interconnect locations 132. The interconnect locations 132 are arranged in a pattern that defines the vertical electrical interconnection interface of the memory circuit 110. FIG. 1 illustrates a small section of the interconnect surface 182 that can include thousands of interconnect locations 132. The interconnect locations 132 are coupled to corresponding access lines in the memory array 160 via conductors 130, thereby enabling the selection of specific rows or columns of the memory array 160 as described below.

The memory array 160 may be implemented in a variety of different 2D or 3D memory architectures, including those described above. The memory array 160 may also be implemented with a variety of memory cells, including varieties of random access memory, read only memory, and other non-volatile memory, using storage technologies such as floating gate, charge trapping, programmable resistance, phase change, etc. In some embodiments, the memory array 160 is implemented using stacked thin film transistor structures such as those described in U.S. Pat. Nos. 7,473,589 and 7,709,334, the disclosures of which are incorporated by reference herein.

The peripheral circuit 175 also includes an interconnect surface 180 having a set of interconnect locations 134. The interconnect locations 134 are arranged in a pattern that defines the vertical electrical interconnection interface of the peripheral circuit 175.

The interconnect interface 181 between the interconnect surface 182 and the and the interconnect surface 180 serves to electrically connect specific interconnect locations 134 to corresponding interconnect locations 132. The interconnect interface 181 also serves to electrically isolate remaining interconnect locations 132, 134 from one another. In doing so, the interconnect interface 181 vertically connects the peripheral circuit 175 to individual access lines in the memory array 160.

The peripheral circuit 175 provides the control signals such as bias signals, timing signals, switch control signals and so on, for operation of the memory circuit 110. The peripheral circuit 175 includes conductors 162 coupled to the word lines in the memory array 160 via the complementary interconnect surfaces 182, 180 and interconnect interface 181. The conductors 162 extend to a row decoder 161. Conductors 164 couple a column decoder 163 to the bit lines in the memory array 160 via the interconnect surfaces 182, 180, interconnect interface 181 and conductors 130. Addresses are supplied on bus 165 to row decoder 161 and column decoder 163. Sense amplifiers and data-in structures 166 are coupled to the column decoder 163 in this example via data bus 167. The column decoder 163 and sense amplifiers in block 166 can be arranged in a page buffer structure allowing for wide, parallel read and write operations. Data is supplied via the data-in line 171 from input/output ports on the integrated circuit memory device 100, to the data-in structures in block 166. In the illustrated embodiment, other circuitry 174 is included in the peripheral circuit 175, such as a general purpose processor or special purpose application circuitry, or a combination of modules providing system-on-a-chip functionality supported by the memory array 160. Data is supplied via the data-out line 172 from the sense amplifiers in block 166 to input/output ports on the peripheral circuit 175, or to other destinations internal or external to the integrated circuit 175.

A controller implemented in this example using bias arrangement state machine 169 controls the application of bias arrangement supply voltages generated or provided through the voltage supply or supplies in block 168, such as read and program voltages. These bias arrangement supply voltages, as well as other control signals, are then provided to the memory circuit 110 through the interconnect surfaces 182, 180 and interconnect interface 181. The controller can be implemented using special-purpose logic circuitry as known in the art. In alternative embodiments, the controller comprises a general-purpose processor, which may be implemented in the peripheral circuit 175, which executes a computer program to control the operations of the device 100. In yet other embodiments, a combination of special-purpose logic circuitry and a general-purpose processor may be utilized for implementation of the controller.

A variety of different techniques can be used for stacking the peripheral circuit 175 and the memory circuit 110 to establish the electrical interconnection via the interconnect interface 181. For example, a patterned conductive material may be applied to one or both of the interconnect surfaces 182, 180. The material may for example be a conductive bonding adhesive or a solder material. The peripheral circuit 175 and the memory circuit 110 can then be stacked such that the interconnect surfaces 182, 180 are mated directly together. In some embodiments, the stacking and bonding processes may be performed using through-silicon-via (TSV) technology such as that described in U.S. Pat. No. 7,683,459 to Ma et al., the disclosure of which is incorporated by reference herein.

In some embodiments, the interconnect interface 181 includes an interposer inserted between the interconnect surfaces 182, 180. An interposer can comprise a semiconductor substrate with metal layers arranged to conduct signals between the interconnect surfaces, and including structures like TSV technology for coupling contacts on one side of the interposer with the other. The interposer includes opposite sides with respective interconnect locations. Conductive members extending between the interconnect locations form conductive pathways between the opposite sides. In some embodiments, the interposer can include additional circuitry, such as amplifiers repeaters, inductors, capacitors and diodes, to support the communication of signals and impedance matching between the layered memory and peripheral circuitry.

The physical separation of the memory circuit 110 and the peripheral circuit 175 enables the use of independent fabrication process technologies, one for the memory circuit 110 and another for the supporting peripheral circuit 175 (and yet another for the optional interposer). For example, the memory circuit 110 and the peripheral circuit 175 can be formed separately using different processes on different substrates in different fabrication lines. As a result, the peripheral circuit 175 can be formed using logic only processes such as those used to form static random access memory (SRAM), rather than the more complicated combined logic/memory processes used for conventional memory. This results in the ability to design a high performance peripheral circuit 175 at low cost. Similarly, the memory circuit 110 can be fabricated using a memory process technology without consideration for the fabrication process technology of the peripheral circuit 175.

Even with the cost of the joining processes, the separate formation of the memory circuit 110 and the peripheral circuit 175 can lower the net cost per memory cell considerably. For example, assume that the memory circuit 110 and the peripheral circuit 175 occupy the same die area and their respective process technologies include no common process steps. Also assume that memory circuit 110 and the peripheral circuit 175 each require the formation of 20 layers of material, at a cost of $50 per layer. Under these assumptions, forming the memory circuit 110 together with the peripheral circuit 175 would result in a die cost of about (20*$50+20*$50)/1000, or $2. In contrast, forming the memory circuit 110 and the peripheral circuit 175 separately results in a die cost of about (20*$50/2000)+(20*$50/2000)+cost of stacking and bonding, or $1 plus the cost of joining processes. Therefore if the cost of joining the circuits is less than $1, then separating the memory and peripheral circuits will be less costly than implementing them on a single wafer.

The physical separation of the memory circuit 110 and the peripheral circuit 175 also enables modularization of each. This modularization can provide different operating modes, such as different read or write operations, for different memory cells on the same memory device 100. These different operating modes enable different memory cells to provide different memory characteristics.

Figure 2:
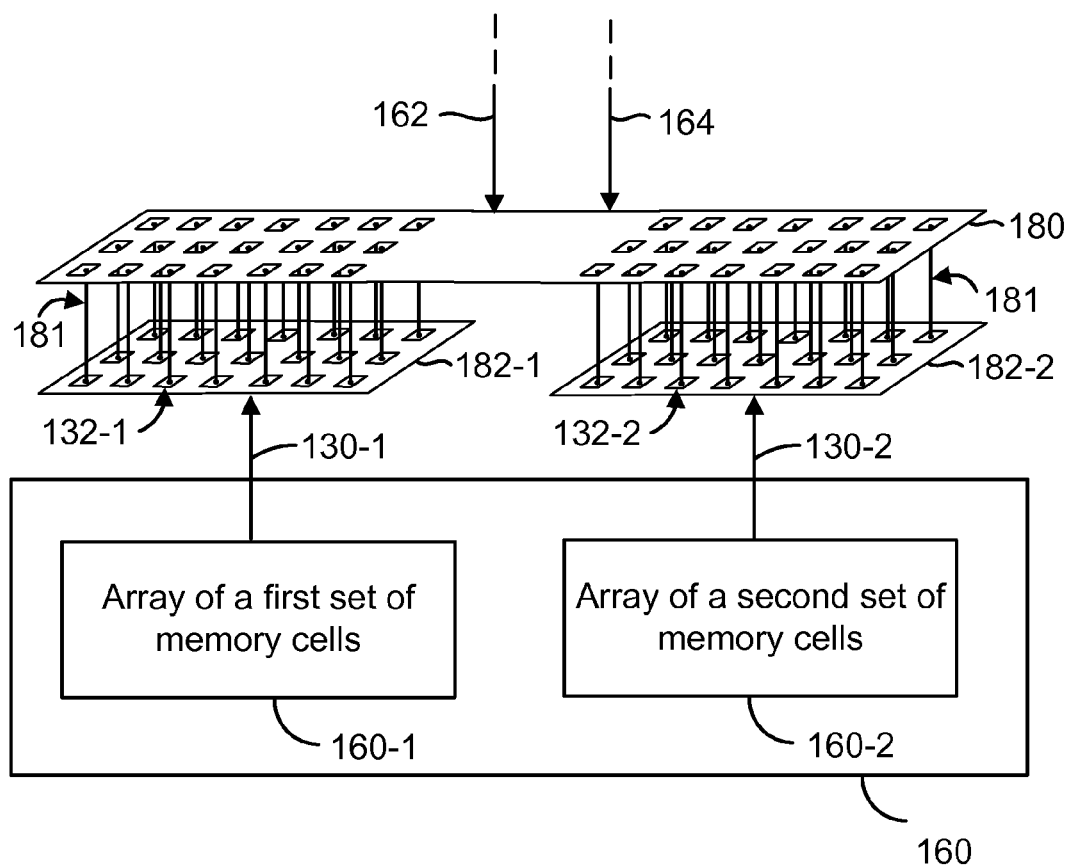
FIG. 2 is a simplified block diagram of a memory circuit including a first set of memory cells and a second set of memory cells.

FIG. 2 is a simplified block diagram of a memory circuit 110 including a first set of memory cells 160-1 and a second set of memory cells 160-2. As shown in FIG. 2, the first set of memory cells 160-1 are coupled to an interconnect surface 182-1 having a set of interconnect locations 132-1 via conductors 130-1. The second set of memory cells 160-2 are coupled to an interconnect surface 182-2 having a set of interconnect locations 132-2 via conductors 130-2. The interconnect interface 181 between the interconnect surfaces 182-1, 182-2 and the interconnect surface 180 serves to electrically connect specific interconnect locations 134 to corresponding interconnect locations 132-1, and 132-2.

The peripheral circuit 175 generates operational signals for operation of the first and second sets of memory cells 160-1, 160-2. Operational signals are signals generated by control logic in the peripheral circuit 175 to perform operating modes, such as read or write operations, on the first and second sets of memory cells 160-1, 160-2. In the illustrated embodiment, the peripheral circuit 175 generates different operational signals for the first and second sets of memory cells 160-1, 160-2. For example, the operational signals generated by the peripheral circuit 175 to perform a read operation on the first set of memory cells 160-1 may be different from those generated to perform a read operation on the second set of memory cells 160-2. The differences between the operational signals may include for example one or more of different logical sequences, different command sets, and different timing signals.

The different operating modes may be utilized in conjunction with differences between the first and second sets of memory cells 160-1, 160-2 to provide different memory characteristics. For example, the first and second sets of memory cells 160-1, 160-2 may have different types of memory cells, have different array configurations, have different array sizes, and/or include materials with different properties.

The first set of memory cells 160-1 may for example be arranged to provide random access and have relatively short bit line/word line lengths. Such a configuration can provide high program/erase speeds, such as may be required in RAM memory. The second set of memory cells 160-2 may be arranged in a NAND or NOR configuration with relatively long bit line/word line lengths. Such a configuration can provide good array efficiency, such as may be required in flash memory.

The modularization through the use of separate interconnect surfaces 182-1, 182-2 can also enable independent operation of each set of memory cells. For example, a read operation can be performed on one set of memory cells, while at the same time a program operation is being performed on another set of memory cells. This independent operation of the sets of memory cells can also be used to reduce power consumption. For example, power can be provided to only the sets of memory cells which offer desired operational memory characteristics.

In some embodiments, the set of memory cells 160-1, 160-2 commonly share the peripheral circuit 175. Alternatively, similar modularization can occur in some or all of the circuits within the peripheral circuit 175. For example, the peripheral circuit 175 may include sets of sense amplifiers having different operational characteristics such as sense speed. In operation, a given set of sense amplifiers can then be connected and disconnected to different sets of memory cells, thereby providing a large variety of different operating modes.

Figure 3:
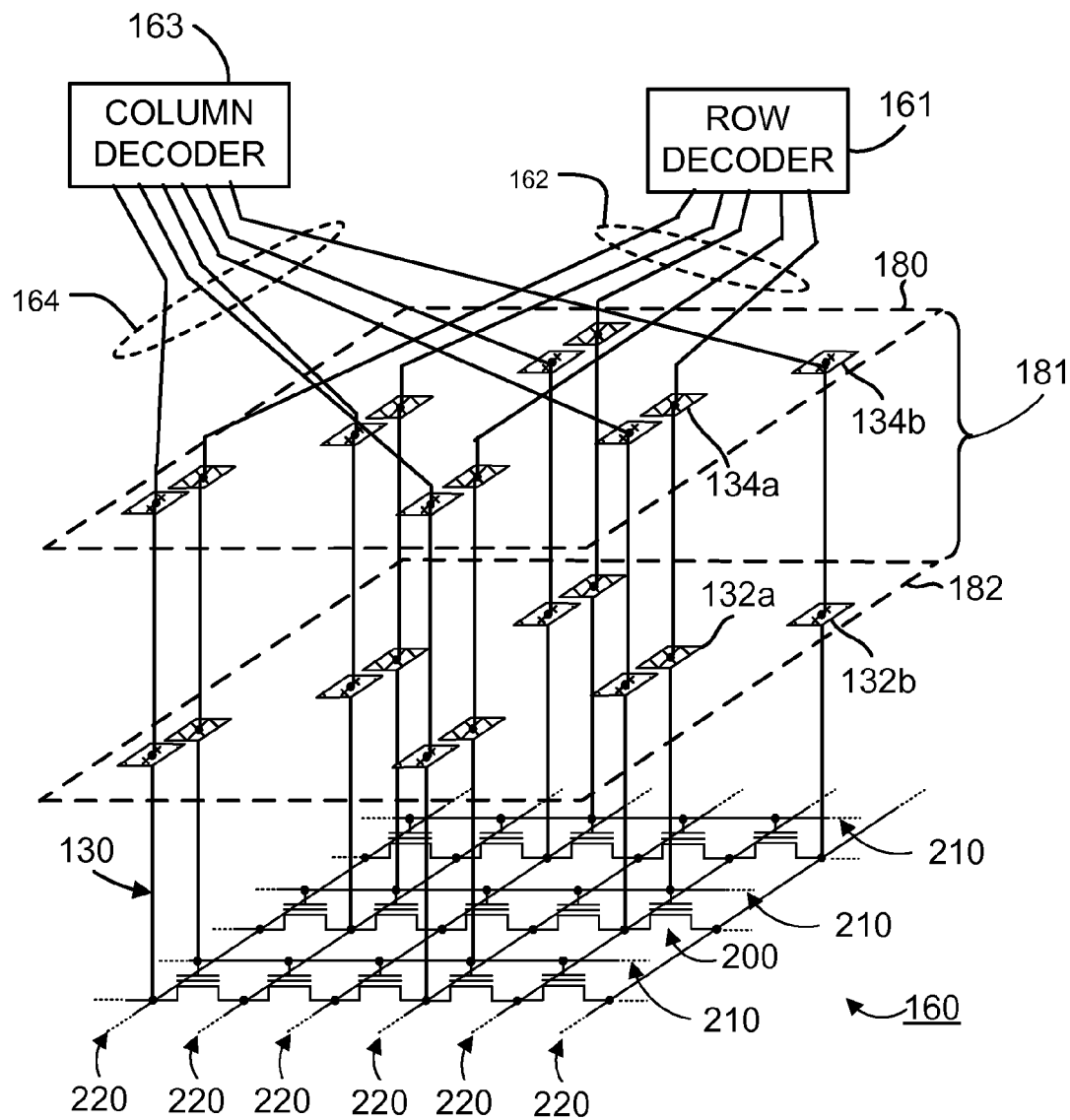
FIG. 3 is a schematic diagram of a portion of a representative memory device having an interconnect interface as described herein.

FIG. 3 is a schematic diagram of a portion of an exemplary stacked integrated circuit memory device 100 having an interconnect interface 181 as described herein. In the FIG. 3, the memory cells 200 in the memory array 160 are SONOS-type charge trapping memory cells. Alternatively, other types of memory cells and/or array configurations may be used.

The memory array 160 includes a plurality word lines 210 extending in parallel along a first direction. As shown in FIG. 3, the gates of the memory cells 200 are connected to corresponding word lines 210. Each of the word lines 210 is coupled via corresponding conductors 130 to corresponding word line interconnect locations 132a on the interconnect surface 182. The word line interconnect locations 132a are coupled via the interconnect interface 181 to corresponding word line interconnect locations 134a on the interconnect surface 180. The word line interconnect locations 134a are then coupled to the row decoder 161 via conductors 162. The row decoder 161 is responsive to addresses to apply voltages to selected word lines 210 through this structure. The level and duration of the voltages applied are dependent upon the operation performed, e.g. a reading operation or a programming operation.

The memory array 160 also includes a plurality of bit lines 220 extending in parallel along a second direction. As shown in FIG. 3, the sources and drain regions of the memory cells 200 are connected to corresponding bit lines 220. Each of the bit lines 220 is coupled via corresponding conductors 130 to corresponding bit line interconnect locations 132b on the interconnect surface 182. The bit line interconnect locations 132b are coupled via the interconnect interface 181 to corresponding bit line interconnect locations 134b on the interconnect surface 180. The bit line interconnect locations 134b are coupled to the column decoder 163 via conductors 164. The column decoder 163 is responsive to addresses to apply voltages to selected bit lines 220 through this structure.

Figure 4:
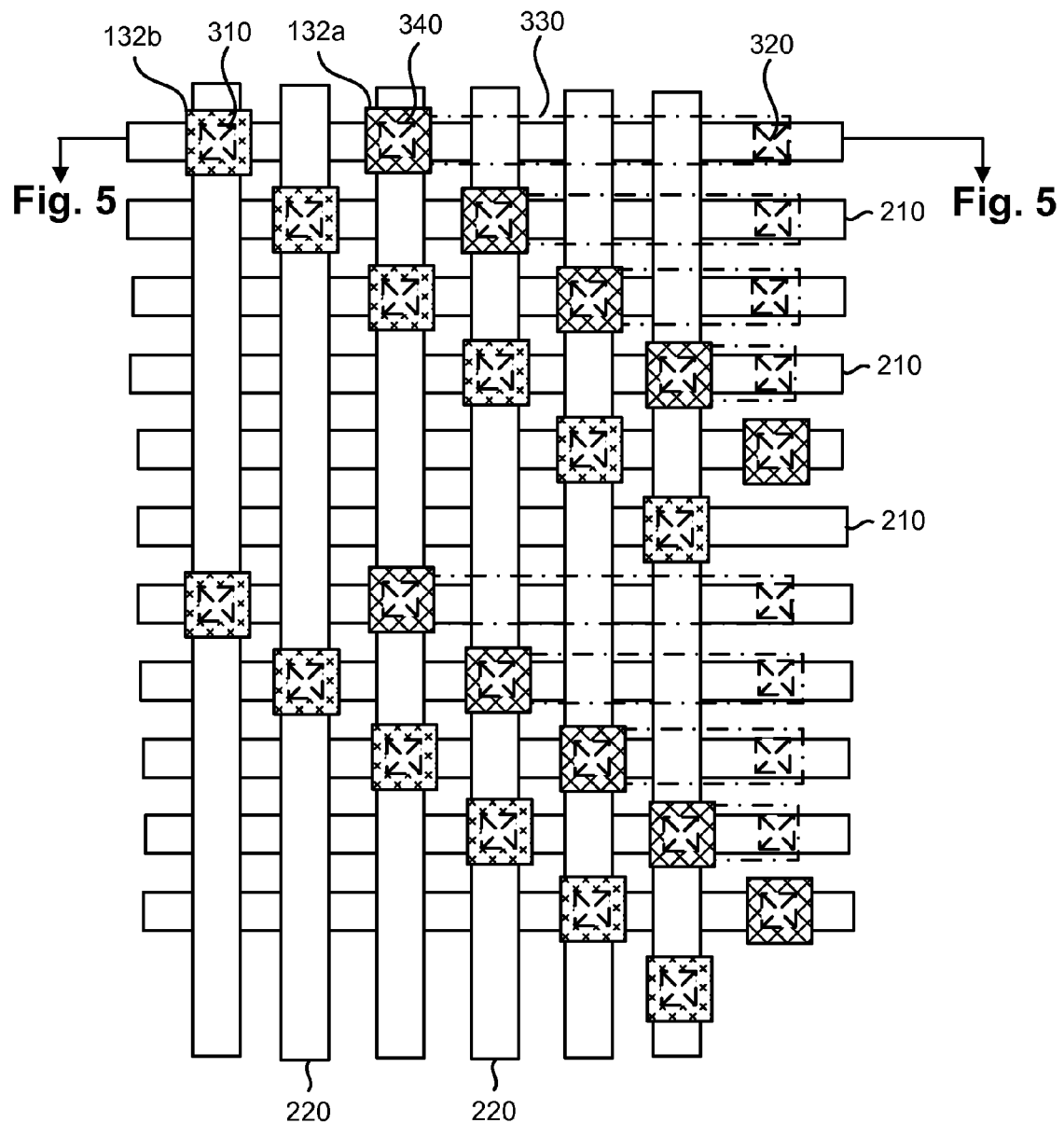
FIG. 4 illustrates an exemplary layout view of the memory circuit, showing an arrangement of the interconnect locations on the interconnect surface.
Figure 5:
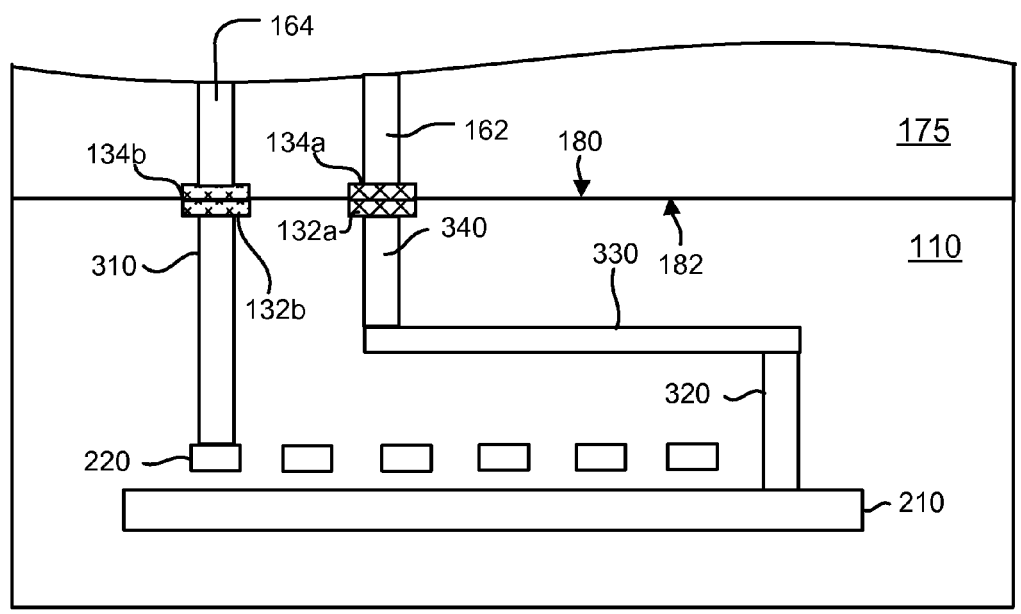
FIG. 5 illustrates an exemplary cross-sectional view of the memory circuit.

FIG. 4 illustrates an exemplary layout view of the memory circuit 130, showing the connection of the interconnect locations 132 on the interconnect surface 182 to memory array 160. FIG. 5 illustrates an exemplary cross-sectional view of the memory circuit 130 along the word lines 210.

In the illustrated example, the bit lines 220 overlie the word lines 210. Contact plugs (e.g. 310) connect the bit lines 220 to overlying bit line interconnect locations 132b on the interconnect surface 182. The bit line interconnect locations 132b in this example are in direct contact with corresponding bit line interconnect locations 134b on the interconnect surface 180 of the peripheral circuit 175. As described above, the column decoder 163 is coupled to conductors 164 to apply voltages to selected bit lines 220 through this structure.

Contact plugs (e.g. 320) connect the word lines 210 to corresponding conductive extensions (e.g. 330). The corresponding conductive extensions extend in parallel with the word lines 210 and overly the bit lines 220. Contact plugs (e.g. 340) then connect the conductive extensions to the corresponding word line interconnect locations 132a on the interconnect surface 182. As described above, the row decoder 161 is responsive to addresses to apply voltages to selected word lines 210 through this structure. Ground and other decoders may also be coupled to the memory circuit 110 in a similar fashion, as required by the configuration of the memory circuit 110.

As shown in FIG. 4, a plurality of word line interconnect locations 132a are connected to each of the word lines 110 in a distributed fashion. Similarly, a plurality of bit line interconnect locations 132b can be connected to each of the bit lines 120. These additional vertical interconnects provide redundancy which can improve manufacturing yield.

Figure 6:
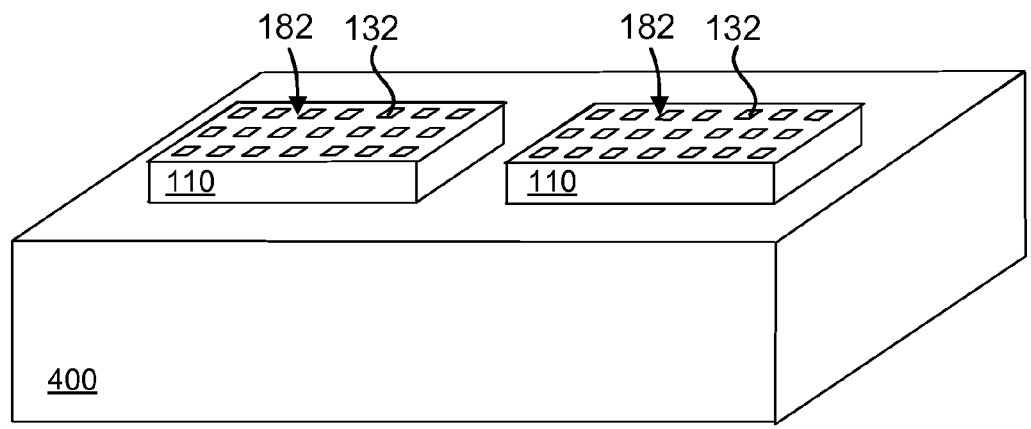
FIGS. 6-8 illustrate stages in a process flow for forming a stacked integrated circuit memory device including a memory circuit and a peripheral circuit as described herein.
Figure 7:
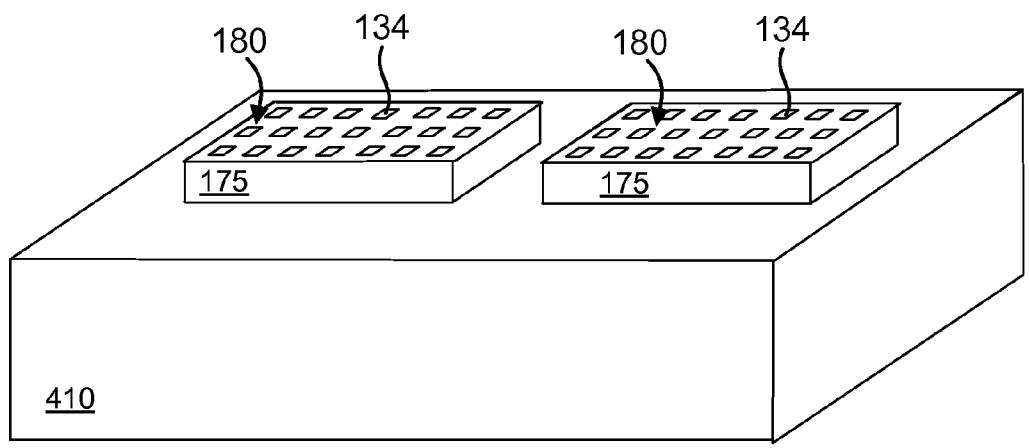
Figure 8:
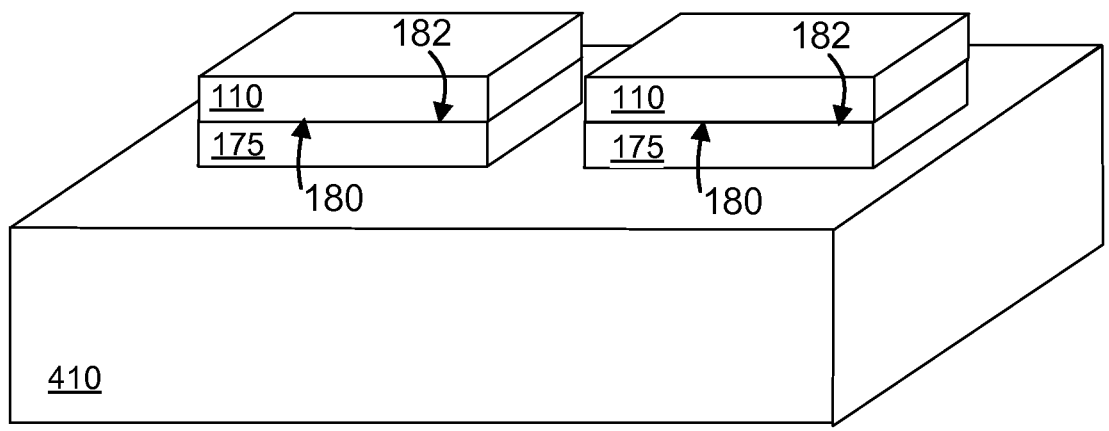

FIGS. 6-8 illustrate stages in a process flow for forming a stacked integrated circuit memory device 100 including a memory circuit 110 and a peripheral circuit 175 as described herein.

FIG. 6 shows the result of the formation of a number of memory circuits 110 on a first substrate 400. The first substrate 400 may for example comprise polysilicon or other semiconductor material. The first substrate 400 may alternatively comprise a non-semiconductor material such as SiO2, SiC, SiN or an epoxy. In yet other embodiments, the first substrate 400 may comprise flexible substrate material such as plastic material. In some embodiments, the first substrate 400 includes a re-usable substrate on which additional memory circuits 110 are subsequently formed. For illustration purposes, only two memory circuits 110 are shown in FIG. 6, although hundreds or thousands of memory circuits 110 may be formed on the first substrate 400.

The memory circuit 110 may be formed using standard processes as known in the art. Generally, the memory circuit 110 may include memory cells, access lines such as word lines, bit lines and source lines, conductive plugs, doped semiconductor material, advance memory materials, like phase change materials, ferromagnetic materials, high-k dielectrics, and so on, and other structures for use in memory circuits. In some embodiments, the memory circuit 110 includes word line driver and bit line precharge circuitry. In some implementations, part or all of the decoder circuitry can be formed on the memory circuit. In other embodiments, such examples described above, the memory circuit 110 does not include decoder circuitry.

The memory circuit 110 may be implemented in a variety of different 2D or 3D memory architectures, including those described above. The memory array 160 may also be implemented with a variety of memory cells, including read only memory, floating gate, charge trapping, etc. In some embodiments, the memory circuit 110 is formed using stacked thin film transistor techniques such as those described in U.S. Pat. Nos. 7,473,589 and 7,709,334, the disclosure of which was previously incorporated by reference herein.

As part of formation of the memory circuit, one approach to interconnection includes opening vias in the memory circuit 110 at the positions of the interconnect locations 132. Contact plugs can be formed in the vias such that contact is made to corresponding access lines in the memory circuit 110. Overlying interconnect locations 132 are then patterned to contact the contact plugs, thereby forming the interconnect surface 182. The interconnect surface 182 can include thousands of interconnect locations 132. However, for the purposes of illustration a small number which are not to scale are shown in FIG. 6.

FIG. 7 shows the result of the formation of the peripheral circuit 175 on a second substrate 410. The peripheral circuit 175 is configured to provide control signals such as bias signals, timing signals and so on, for operation of the memory circuit 110. The peripheral circuit 175 may be formed using logic processes in manufacturing lines optimized for such processes. The peripheral circuit 175 may include for example decoder circuitry, page buffers, charge pumping circuits, a controller such as a state machine, other memory circuitry such as static random access memory (SRAM) for cache memory, a general purpose processor or special purpose application circuitry, and other circuitry known in the art for supporting integrated circuit memory functionality. The interconnect locations 134 coupled to corresponding contact plugs can be formed using similar techniques to those described above for the interconnect locations 132.

FIG. 8 shows the result of joining the interconnect surface 182 of the memory circuit 110 directly to the interconnect surface 180 of the peripheral circuit 175. This joining serves to electrically connect specific interconnect locations 134 to corresponding interconnect locations 132. The joining also serves to electrically isolate remaining interconnect locations 132, 134 from one another. In doing so, the peripheral circuit 175 is vertically connected to individual access lines in the memory array 160.

A variety of different techniques can be used for joining the peripheral circuit 175 and the memory circuit 110 to establish vertical electrical interconnection, including those described above.

In the illustrated embodiment, the memory circuit 110 is inverted and placed on the peripheral circuit 175, with or without an interposer. Alternatively, the peripheral circuit 175 may be placed on top of the memory circuit 110, with or without an interposer.

Figure 9:
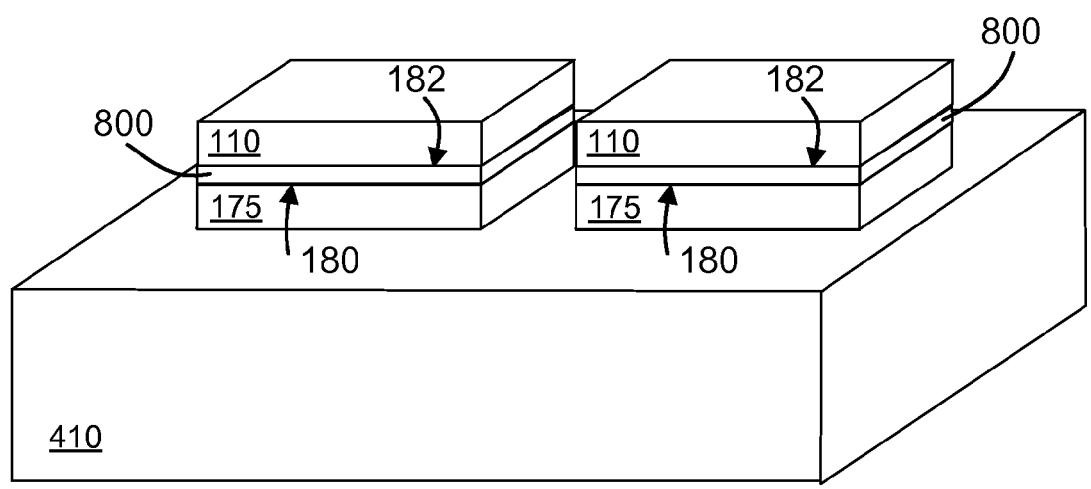
FIG. 9 illustrates an alternative embodiment in which the memory circuit is indirectly joined to the peripheral circuit through the use of an interposer.

FIG. 9 illustrates an alternative embodiment in which the memory circuit 110 is indirectly joined to the peripheral circuit 175 through the use of interposer 800. In such a case, the memory circuit 110 and the peripheral circuit 175 are joined through the interposer 800.

Figure 10:
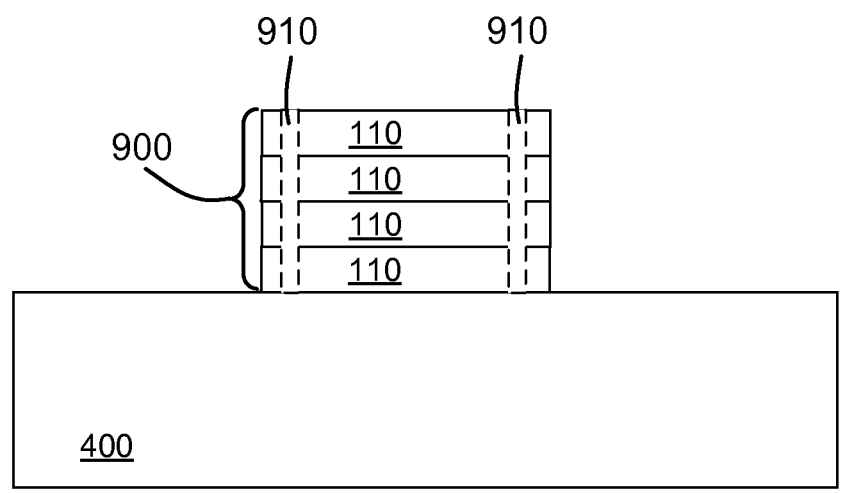
FIG. 10 illustrates a cross-sectional view of an exemplary stacked structure including a plurality of memory circuits stacked upon one another.

A plurality of memory circuits 110 may also be stacked upon one another so they behave as a single device prior to joining with the peripheral circuit 175. A cross-sectional view of an exemplary stacked structure 900 is illustrated in FIG. 10. The memory circuits 110 may be interconnected vertically by forming vias 910 which pass completely through the stacked structure 900 using for example TSV technology. In other embodiments, multiple layers of peripheral circuitry may be included in a stack, such as that of FIG. 10, with one or more layers of memory circuitry.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, the method comprising:
    forming a memory circuit on a first substrate comprising an array of memory cells having a plurality of word lines and a plurality of bit lines, the memory circuit having a first interconnect surface with a first set of interconnect locations, the first set of interconnect locations including interconnect locations electrically connected by conductors to corresponding word lines in the plurality of word lines, and interconnect locations electrically connected by conductors to bit lines in the plurality of bit lines, wherein said conductors to corresponding word lines in the plurality of word lines include extensions parallel to the word lines and overlying bit lines in the plurality of bit lines;

forming a peripheral circuit on a second substrate including sense amplifiers and circuits configured to provide control signals for operation of the memory circuit to the plurality of word lines and the plurality of bit lines, the peripheral circuit having a second interconnect surface with a second set of interconnect locations electrically connected by conductors to the peripheral circuit; and joining the first interconnect surface of the memory circuit to the second interconnect surface of the peripheral circuit.

2. The method of claim 1, wherein the second interconnect surface overlies the first interconnect surface upon the joining of the first interconnect surface to the second interconnect surface.

3. The method of claim 1, wherein:
forming the memory circuit includes performing a first manufacturing process to form the array of memory cells on the first substrate; and
forming the peripheral circuit includes performing a second manufacturing process to form the peripheral circuitry on the second substrate, the second manufacturing process different from the first manufacturing process.

4. The method of claim 1, wherein the joining comprises bonding the first interconnect surface directly to the second interconnect surface.

5. The method of claim 1, wherein interconnect locations in the first set of interconnect locations are arranged in a pattern on the first interconnect surface that corresponds to a pattern of interconnect locations in the second set of interconnect locations on the second interconnect surface, such that interconnect locations in the first set of interconnect locations are aligned with the corresponding interconnect locations in the second set of interconnect locations upon the joining of the first interconnect surface to the second interconnect surface.

6. The method of claim 1, further wherein joining the first interconnect surface to the second interconnect surface comprises:
joining the first interconnect surface of the memory circuit to an interposer, such that interconnect locations in the first set of interconnect locations are electrically connected to corresponding conductive members on the interposer; and
joining the second interconnect surface of the peripheral circuit to the interposer, such that interconnect locations in the second set of interconnect locations are electrically connected to corresponding conductive members on the interposer.

7. The method of claim 1, wherein:
forming the memory circuit and forming the peripheral circuit includes forming one of the memory circuit and the peripheral circuit on a substrate, and removing the one of the memory circuit and the peripheral circuit from the substrate; and
joining the first interconnect surface to the second interconnect surface comprises mating the one of the memory circuit and the peripheral circuit to the other of the memory circuit and the peripheral circuit upon removal from the substrate.

8. The method of claim 1, wherein the peripheral circuit is configured to generate first operational signals to operate a first memory cell in the plurality of memory cells, and to generate second operational signals to operate a second memory cell in the plurality of memory cells, the first operational signals different from the second operational signals.

9. The method of claim 1, wherein:
the memory circuit includes the first mentioned array of memory cells and a second array of memory cells, the first mentioned array and the second array having separate word lines and separate bit lines and having different access timing, the first set of interconnect locations including interconnect locations electrically connected by conductors to corresponding word lines in the separate word lines of the second array and interconnect locations electrically connected by conductors to the separate bit lines of the second array; and
the peripheral circuit is configured to apply different timing to the first array and the second array.

10. A memory device comprising:
a memory circuit on a first substrate comprising an array of memory cells having a plurality of word lines and a plurality of bit lines, the memory circuit having a first interconnect surface with a first set of interconnect locations, the first set of interconnect locations including interconnect locations electrically connected by conductors to corresponding word lines in the plurality of word lines and interconnect locations electrically connected by conductors to bit lines in the plurality of bit lines, wherein said conductors to corresponding word lines in the plurality of word lines include extensions parallel to the word lines and overlying bit lines in the plurality of bit lines; and
a peripheral circuit on a second substrate including sense amplifiers and a circuit configured to provide control signals for operation of the memory circuit to the plurality of word lines and the plurality of bit lines, the peripheral circuit having a second interconnect surface with a second set of interconnect locations electrically connected by conductors to the peripheral circuit;
wherein the second interconnect surface of the peripheral circuit is joined to the first interconnect surface of the memory circuit by an interconnect interface.

11. The device of claim 10, wherein the second interconnect surface overlies the first interconnect surface.

12. The device of claim 10, wherein the interconnect interface includes a direct bond of the second interconnect surface to the first interconnect surface.

13. The device of claim 10, wherein interconnect locations in the first set of interconnect locations are arranged in a pattern on the first interconnect surface that corresponds to a pattern of interconnect locations in the second set of interconnect locations on the second interconnect surface, such that interconnect locations in the first set of interconnect locations are aligned with the corresponding interconnect locations in the second set of interconnect locations.

14. The device of claim 10, the interconnect interface comprising an interposer having first and second sides and conductive members extending between the first and second sides, and wherein:
the first interconnect surface of the memory circuit is joined to the first side of the interposer, such that interconnect locations in the first set of interconnect locations are electrically connected to corresponding conductive members on the first side of the interposer; and the second interconnect surface of the peripheral circuit is joined to the second side of the interposer, such that interconnect locations in the second set of interconnect locations are electrically connected to corresponding conductive members on the second side of the interposer.

15. The device of claim 10, wherein the peripheral circuit is configured to generate first operational signals to operate a first memory cell in the plurality of memory cells, and to generate second operational signals to operate a second memory cell in the plurality of memory cells, the first operational signals being different from the second operational signals.

16. The device of claim 10, wherein:

the memory circuit includes the first mentioned array of memory cells and a second array of memory cells, the first mentioned array and the second array having separate word lines and separate bit lines and having different access timing, the first set of interconnect locations including interconnect locations electrically connected by conductors to corresponding word lines in the separate word lines of the second array and interconnect locations electrically connected by conductors to the separate bit lines of the second array; and the peripheral circuit is configured to apply different timing to the first mentioned array and the second array.

* * * * *